(12) United States Patent
Kimura et al.

(10) Patent No.: US 7,015,735 B2
(45) Date of Patent: Mar. 21, 2006

(54) SEMICONDUCTOR INTEGRATED CIRCUIT HAVING BUILT-IN PLL CIRCUIT

(75) Inventors: Yasuyuki Kimura, Maebashi (JP); Satoshi Shimizu, Maebashi (JP); Masakatsu Yokota, Takasaki (JP); Ken Suyama, Mamaroneck, NY (US); Aleksander Dec, Tarrytown, NY (US)

(73) Assignees: Renesas Technology Corp., Tokyo (JP); Epoch Microelectronics, Inc., Hawthorne, NY (US)

( * ) Notice: Subject to any disclaimer, the term of this patent is extended or adjusted under 35 U.S.C. 154(b) by 103 days.

(21) Appl. No.: 10/739,117

(22) Filed: Dec. 19, 2003

(65) Prior Publication Data

US 2005/0134391 A1    Jun. 23, 2005

(51) Int. Cl.
*H03L 7/06* (2006.01)
(52) U.S. Cl. .................. 327/157; 331/16; 375/376
(58) Field of Classification Search .............. 327/147, 327/148, 156, 157, 162, 538–543; 375/373–376; 331/15–17, 14, DIG. 2
See application file for complete search history.

(56) References Cited

U.S. PATENT DOCUMENTS

| 4,546,330 A | * | 10/1985 | Okada ..................... 331/17 |
| 5,604,466 A | * | 2/1997 | Dreps et al. ............. 331/113 R |
| 5,886,551 A | * | 3/1999 | Narahara ................. 327/157 |
| 6,819,197 B1 | * | 11/2004 | Maldonado ............. 333/17.1 |
| 6,826,248 B1 | * | 11/2004 | Kushibe ................... 375/376 |

OTHER PUBLICATIONS

Koo, Y. et al, "A Fully Integrated CMOS Frequency Synthesizer With Charge-Averaging Charge Pump and Dual-Path Loop Filter for PCS- and Cellular-CDMA Wireless System", IEEE Journal of Solid-State Circuits, vol. 37, No. 5, May 2002, pp. 536-542.

* cited by examiner

*Primary Examiner*—Minh Nguyen
(74) *Attorney, Agent, or Firm*—Mattingly, Stanger, Malur & Brundidge, P.C.

(57) ABSTRACT

A semiconductor integrated circuit having a built-in PLL circuit which has two charge pump circuits for charging and discharging capacitive elements of a loop filter in response to signals generated by a phase comparator circuit. One of the two charge pump circuits has current sources which generate current values smaller than those generated by current sources of the other charge pump circuit. The loop filter has a first capacitive element connected to a charge/discharge node, and a second capacitive element connected to the charge/discharge node through a resistive element. The first capacitive element is charged and discharged by the one charge pump circuit, while the second capacitive element is charged and discharged by the other charge pump circuit. A charging current source of the one charge pump circuit operates simultaneously with a discharging current source of the other charge pump circuit, i.e., the charge pump circuits operate in opposite phase.

7 Claims, 10 Drawing Sheets

SEMICONDUCTOR INTEGRATED CIRCUIT HAVING BUILT-IN PLL CIRCUIT

CROSS-REFERENCE TO RELATED APPLICATION

The present application relates to subject matters described in a co-pending application Ser. No. 10/253,922 filed on Sep. 25, 2002 assigned to the assignee of the present application. The disclosures of the co-pending application are incorporated herein by reference.

BACKGROUND OF THE INVENTION

The present invention relates to a phase locked loop (PLL) including a voltage controlled oscillator (VCO) circuit, and more particularly to techniques which are effectively applied to incorporation of a loop filter on a PLL into a semiconductor chip. More specifically, the present invention relates to techniques which are effectively utilized for a transmission PLL loop in a high frequency semiconductor circuit, for example, used in radio communication devices such as a portable telephone for modulating and upconverting a transmission signal.

A radio communication device (mobile communication device) represented by a portable telephone typically comprises a semiconductor integrated circuit (generally referred to as a high frequency IC) which has functions of upconverting and modulating a transmission signal, downconverting and demodulating a received signal, and the like; a semiconductor integrated circuit (baseband IC) which has functions of converting a transmission signal to I, Q signals, and recovering reception data from demodulated I, Q signals; an electronic part referred to as a power module which contains a high frequency power amplifier, an associated bias circuit, an impedance matching circuit, and the like; and an electronic part referred to as a front end module which contains a transmission/reception switching circuit, a low pass filter, an impedance matching circuit and the like.

In radio communication devices, with the recent trend of reducing the number of parts for a smaller size and a lower cost of the devices, conscious efforts have been made to incorporate as many circuits as possible into a single or several semiconductor integrated circuits. One of such efforts includes an attempt to provide a semiconductor chip with a built-in loop filter disposed on a loop of a transmission PLL within a high frequency IC.

Generally, a second-order filter FLT as illustrated in FIG. 1 has been used for the loop filter for a transmission PLL within a high frequency IC for providing a loop band characteristic required thereto. A charge pump is generally indicated by CP. FIG. 2 is a graph showing the frequency characteristic of the filter FLT in FIG. 1, which has zero at frequency f1 and a pole at frequency f2. The frequency f1 and the frequency f2 in the illustrated loop filter are expressed by the following equations:

$$f1 = 1/\{2\pi \cdot C1 \cdot R\}$$

$$f2 = (C1+C2)/2\pi \cdot C1 \cdot C2 \cdot R \quad (1)$$

Such a second-order filter employs two capacitive elements, wherein a loop filter for a transmission PLL handles relatively high frequencies, causing the larger capacitive element C1 to have a high capacitive value on the order of nF (nanofarad), which makes it difficult to integrate the capacitive element C1 itself on a chip. Thus, an external element is often used for the capacitive element C1 to make up the loop filter.

On the other hand, in order to reduce the capacitance values of capacitive elements used in a second-order loop filter, a technique has been developed and proposed for providing each capacitive element with a charge pump disposed in front thereof for charging and discharging the capacitive element, for example, as illustrated in FIG. 3 (see, for example, 0018-9200/02 IEEE "A Fully Integrated CMOS Frequency Synthesizer With Charge-Averaging Charge Pump and Dual-Path Loop Filter for PCS- and Cellular-CDMA Wireless System").

SUMMARY OF THE INVENTION

The loop filter illustrated in FIG. 3 comprises a charge pump CP1 made up of a charging current source I11 (=i1) and a discharging current source I12 (=i1) for establishing a frequency characteristic having a cutoff frequency f2, as indicated by a one-dot chain line A in FIG. 5, together with a capacitor C2 and a resistor R; and a charge pump CP2 made up of a charging current source I21 (=i2) and a discharging current source I22 (=i2) for establishing a frequency characteristic, as indicated by a broken line B in FIG. 5, together with a capacitor C1. Then, these frequency characteristics are synthesized by an adder ADD to realize a frequency characteristic, as indicated by a solid line C in FIG. 5, which has a zero point at f1 near the intersection of the curves A, B, and a pole at f2.

It should be noted that when the charge-pumps CP1, CP2 are not separated, a current flows from the current source I11 to I22 or from I21 to I12, so that the adder ADD in FIG. 3 may be actually represented as shown in FIG. 4. BFF in FIG. 4 represents a buffer such as an emitter follower. The zero-point frequency f1 and pole frequency f2 in this loop filter are expressed by the following equations:

$$f1 = 1/\{2\pi \cdot C1(i1/i2) \cdot R\}$$

$$f2 = 1/(2\pi \cdot C2 \cdot R) \quad (2)$$

As can be understood from a comparison of Equation (1) with Equation (2), the frequencies f1 and f2 are determined by the ratio of the capacitors C1 and C2 in the loop filter of FIG. 1, whereas the frequencies f1 and f2 are determined by the ratio of the currents i1 and i2 in the loop filter of FIG. 3. Therefore, when the current i2 is reduced, for example, to one tenth of i1, the result is equivalent to the ratio of the capacitors C1, C2 equal to or higher than 10:1 in the loop filter of FIG. 1, even if the capacitors C1, C2 have similar capacitance values. More specifically, the capacitor C1 in the loop filter of FIG. 1 has a capacitance value on the order of nF, whereas the capacitance values of the capacitors C1, C2 in the loop filter of FIG. 3 can be reduced to several hundred pF (picofarad) which is one order of magnitude smaller. As a result, the loop filter can be integrated on a chip.

However, in an actual circuit implemented as illustrated in FIG. 4, noise generated by the buffer BFF causes an increase in phase error of a PLL loop. Furthermore, when the buffer BFF is applied to a transmission PLL, noises generated from the buffer BFF under operation intrudes into the supply voltage and causes a problem of increasing side-band spurious.

Also, in the charge pumps CP1, CP2, fluctuations in the supply voltage may cause a change in the current values i1, i2 of the current sources, depending on the type of circuit, resulting in a deviation of the loop gain from a desired value. To avoid this deviation, it is contemplated to provide a voltage regulator through which the charge pumps are provided with the supply voltage. However, although a voltage regulator is typically provided with a band gap reference circuit for preventing the generated voltage from varying due to the fluctuating supply voltage and a change in temperature, the band gap reference circuit can be a source of noise in a radio communication system to increase a phase error of the PLL loop and side-band spurious.

Further, since variation of the supply voltage also cause a voltage controlled oscillator (VCO) circuit to vary an oscillation frequency, the VCO is desirably supplied with a supply voltage through a voltage regulator. However, in doing so, similar problems arise as is the case in the charge pumps, i.e., the band gap reference circuit within the voltage regulator acts as a noise source to increase the phase error of the PLL loop and side-band spurious.

It is an object of the present invention to provide a loop filter which comprises a second- or higher order filter including capacitive elements, the capacitance ratio of which can be reduced, allowing the integration of the loop filter on a chip.

It is another object of the present invention to provide a PLL circuit which is free from an increase in phase error even if a loop filter is integrated on a chip.

It is a further object of the present invention to provide a PLL circuit which is free from an increase in side-band spurious even if a loop filter is integrated on a chip when the PLL circuit is applied for use in a transmission PLL.

It is a further object of the present invention to provide a voltage regulator for supplying a supply voltage to charge pumps and a transmission VCO while protecting the charge pumps and transmission VCO from adverse effects due to noise generated by a band gap reference circuit.

Representative features of the present invention herein disclosed will be generally described as follows.

Specifically, in a first aspect of the present invention, a semiconductor integrated circuit has a built-in PLL circuit which includes two charge pump circuits for charging and discharging capacitive elements of a loop filter in response to signals generated by a phase comparator circuit. One of the two charge pump circuits has current sources which generate current values smaller than those generated by current sources of the other charge pump circuit. The loop filter has a first capacitive element connected to a charge/discharge node, and a second capacitive element connected to the charge/discharge node through a resistive element. The first capacitive element is charged and discharged by the one charge pump circuit, while the second capacitive element is charged and discharged by the other charge pump circuit. A charging current source of the one charge pump circuit operates simultaneously with a discharging current source of the other charge pump circuit. In other words, the two charge pump circuits are configured to operate in opposite phase.

According to the semiconductor integrated circuit described above, two capacitive elements having smaller capacitance values can be employed by reducing the ratio of the current values supplied from the current sources which form part of the one charge pump circuit to the current values supplied from the current sources which form part of the other charge pump circuit. The reduction in the capacitance values of the capacitive elements permits the loop filter to be integrated on the semiconductor IC chip. In addition, since the one charge pump circuit operates in opposite phase to the other charge pump circuit, a need is eliminated for disposing a buffer, which can be a noise source, between the resistive element and second capacitive element, thereby making it possible to prevent an increased phase error of the PLL loop and increased side-band spurious.

In a second aspect of the present invention, a semiconductor integrated circuit having a built-in PLL circuit includes a voltage controlled oscillator circuit which operates with a supply voltage generated by a voltage regulator that relies on a base-emitter voltage of a bipolar transistor to generate a predetermined voltage with less source voltage dependency. The voltage regulator includes a voltage regulating circuit which utilizes the base-emitter voltage of the bipolar transistor as a reference voltage for generating the predetermined voltage. The voltage regulator also includes a first resistive element connected in series with the bipolar transistor for generating the base-emitter voltage, a series connection of a second resistive element and a switching element connected in parallel with the first resistive element, and a temperature detector circuit. The switching element is controlled by an output signal of the temperature detector circuit to switch the voltage generated by the voltage regulator in accordance with the temperature detected by the temperature detector circuit.

According to the semiconductor integrated circuit in the second aspect described above, since the voltage regulator relies on the base-emitter voltage of the bipolar transistor to generate the predetermined voltage, the voltage regulator eliminates a reference voltage generator circuit which can be a noise source. Thus, the resulting voltage regulator will not adversely affect the charge pumps and transmission VCO with noise which would be otherwise generated by the reference voltage generator circuit. Also, since the base-emitter voltage has a negative temperature characteristic, the voltage generated by the voltage regulator has temperature dependency. However, the switching element is controlled by the output signal from the temperature detector circuit to switch the generated voltage in accordance with the detected temperature, so that the charge pump and transmission VCO can be supplied with a voltage with less temperature dependency.

Advantages provided by representative aspects of the invention disclosed herein may be summarized as follows.

Specifically, the loop filter can be integrated on a chip. One charge pump circuit is operated in opposite phase to the other charge pump circuit to eliminate the need for a buffer, which can be a noise source, disposed between the resistive element and second capacitive element, thereby making it possible to prevent an increased phase error of the PLL loop and increased side-band spurious.

Also, the voltage regulator, which does not include a reference voltage generator circuit, will not adversely affect the charge pump or transmission VCO. Even if the voltage generated by the voltage regulator has temperature dependency, the switching element is controlled by the output signal from the temperature detector circuit to switch the generated voltage in accordance with the detected temperature, making it possible to supply the charge pumps and transmission VCO with a voltage with less temperature dependency.

The above and other objects, novel features, and advantages of the present invention will become apparent from the following description of the specification with reference to the accompanying drawings.

Other objects, features and advantages of the invention will become apparent from the following description of the embodiments of the invention taken in conjunction with the accompanying drawings.

DESCRIPTION OF THE INVENTION

In the following, preferred embodiments of the present invention will de described with reference to the accompanying drawings.

First Embodiment

Figure 6:
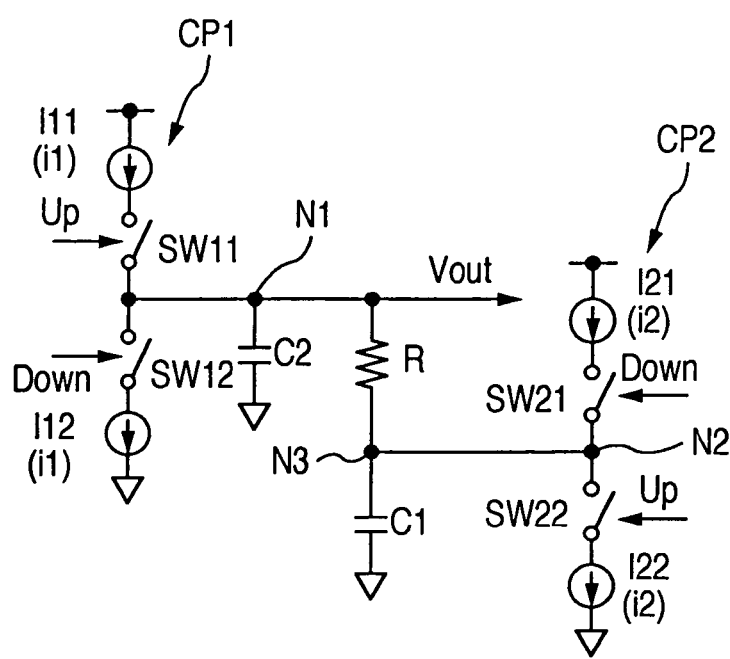
FIG. 6 is a circuit diagram illustrating a second-order loop filter according to one embodiment of the present invention.

FIG. 6 illustrates one embodiment of a loop filter which can be provided on a PLL loop. The loop filter in this embodiment comprises a first charge pump CP1 which is made up of regulated current sources I11, I12, and switches SW11, SW12 connected in series with the regulated current sources I11, I12, respectively; a capacitor C2 connected between an output node N1 of the charge pump CP1 and a ground point; a resistor R and a capacitor C1 connected between the output node N1 and ground point in parallel with the capacitor C2; and a second charge pump CP2 which is made up of regulated current sources I21, I22, and switches SW21, SW22 connected in series with the regulated current sources I21, I22, respectively, and has an output node N2 connected to a connection node N3 at which the resistor R is connected to the capacitor C1.

In the loop filter (FIG. 6) of this embodiment, the switch SW21 for charging the second charge pump CP2 is controlled on/off by a down signal DOWN from a previous circuit (phase comparator circuit) in opposite phase to the switch SW11 for charging the first charge pump CP1. The switch SW22 for discharging the second charge pump CP2 is controlled on/off by an up signal UP from the previous circuit in opposite phase to the switch SW12 for discharging the first charge pump CP1.

Figure 4:
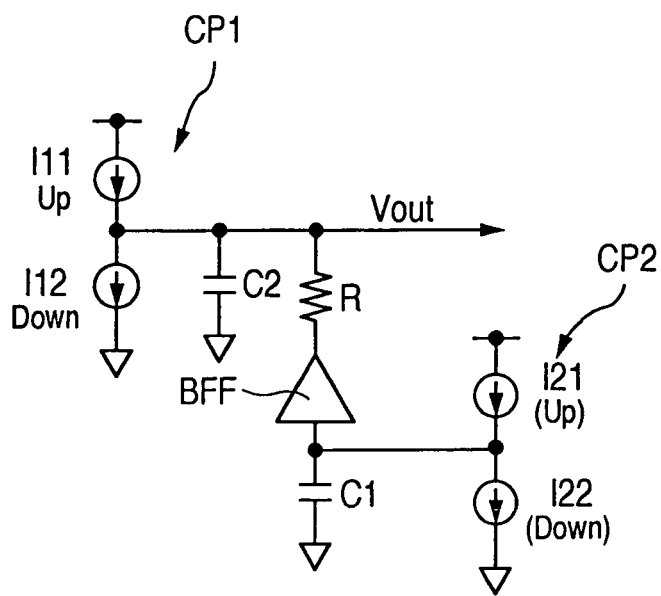
FIG. 4 is a circuit diagram illustrating the configuration of an actual loop filter in FIG. 3.
Figure 5:
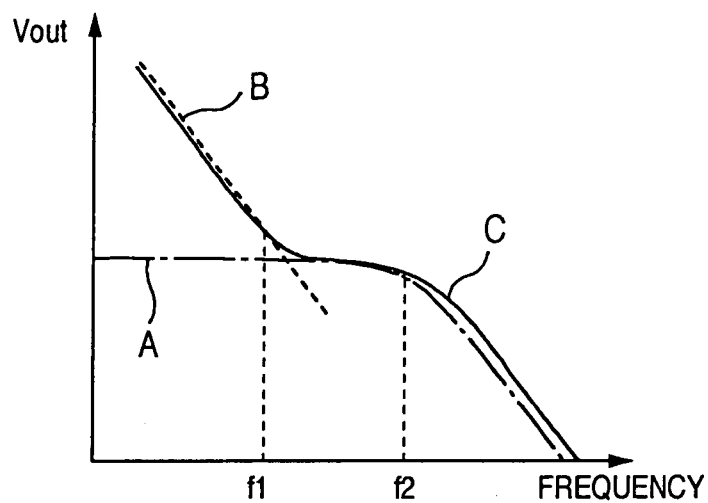
FIG. 5 is a characteristic graph showing the frequency characteristic of the loop filter illustrated in FIG. 3.

When used herein, the foregoing operation of the second charge pump CP2 is referred to as the "opposite-phase operation." In this embodiment, the second charge pump CP2 operated in opposite phase eliminates the need for a buffer which is disposed between the resistor R and connection node N3 in the loop filter illustrated in FIG. 4. It should be noted that in the loop filter of FIG. 4, the switch SW21 associated with the second charge pump CP2 is controlled on/off by a signal in phase with a signal applied to the switch SW11 associated with the first charge pump CP1, and the switch SW22 is controlled on/off by a signal in phase with a signal applied to the switch SW12.

Figure 1:
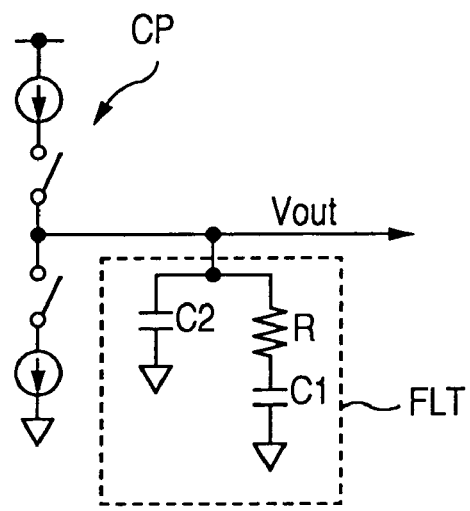
FIG. 1 is a circuit diagram illustrating an exemplary configuration of a second-order loop filter provided on a conventional PLL loop.
Figure 2:
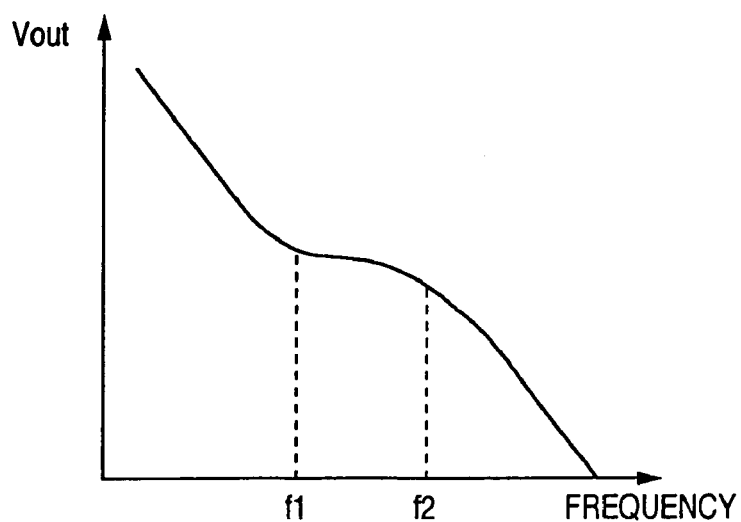
FIG. 2 is a characteristic graph showing the frequency characteristic of the loop filter illustrated in FIG. 1.
Figure 3:
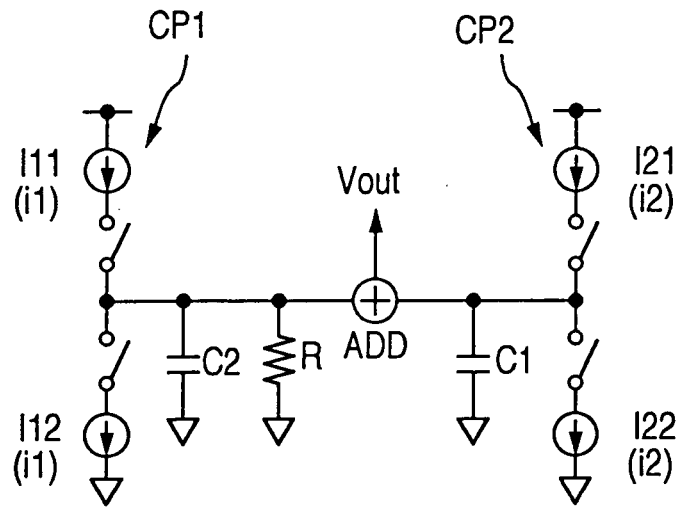
FIG. 3 is a circuit diagram illustrating another exemplary configuration of a conventional second-order loop filter.

The output voltage Vout of the loop filter in FIG. 6 has the same frequency characteristic as that shown in FIG. 2, where a zero point is present at f1, and a pole at f2. The zero point frequency f1 and pole frequency f2 are expressed by the following equation (3):

$$f_1 = \frac{1}{2\pi \cdot \frac{c_1}{1-\beta} \cdot R}$$

$$f_2 = \frac{C_1 + C_2}{2\pi \cdot C_1 \cdot C_2 \cdot R} \approx \frac{1}{2\pi \cdot C1 \cdot R}$$

$$\beta = \frac{i2}{i1}$$

It can be understood from the equation (3) above that when the ratio β (=i2/i1) of the current i2 of the current source associated with the second charge pump CP2 to the current i1 of the current source associated with the first charge pump CP1 is set to 0.9, the resulting filter can have the frequencies f1, f2 as if it had the capacitor C1, the capacitance value of which is reduced by a factor of ten.

It is therefore possible to reduce the capacitance value of the capacitor C1 to a similar capacitance value to the capacitor C2. In a transmission PLL contained in a high frequency IC intended by the inventors for application, since C2 has several hundred picofarads, C1 can be reduced as well to approximately several hundred picofarads. Then, since capacitors having capacitance values as low as the foregoing can be sufficiently formed on a semiconductor chip, the loop filter can be integrated on the semiconductor chip. Further, since this embodiment eliminates the need for the buffer which would be required in the loop filter of FIG. 4 that controls the switches in phase, it is possible to prevent noise generated in the buffer from introducing into the output Vout to increase a phase error of the PLL loop. Moreover, the elimination of the buffer can result in a corresponding reduction in the circuit size.

Next, other embodiments of the loop filter according to the present invention will be described with reference to FIGS. 7 and 8. These embodiments permit the PLL to rapidly pull in upon start of a voltage controlled oscillator (VCO) to enable a high speed lockup operation. A phase comparator, designated by PD, compares the phase of an oscillating signal from the VCO or a signal resulting from a frequency division of the oscillating signal with the phase of a reference signal φref to generate on/off control signals UP, DOWN for the current sources of the charge pump CP1, CP2.

Figure 7:
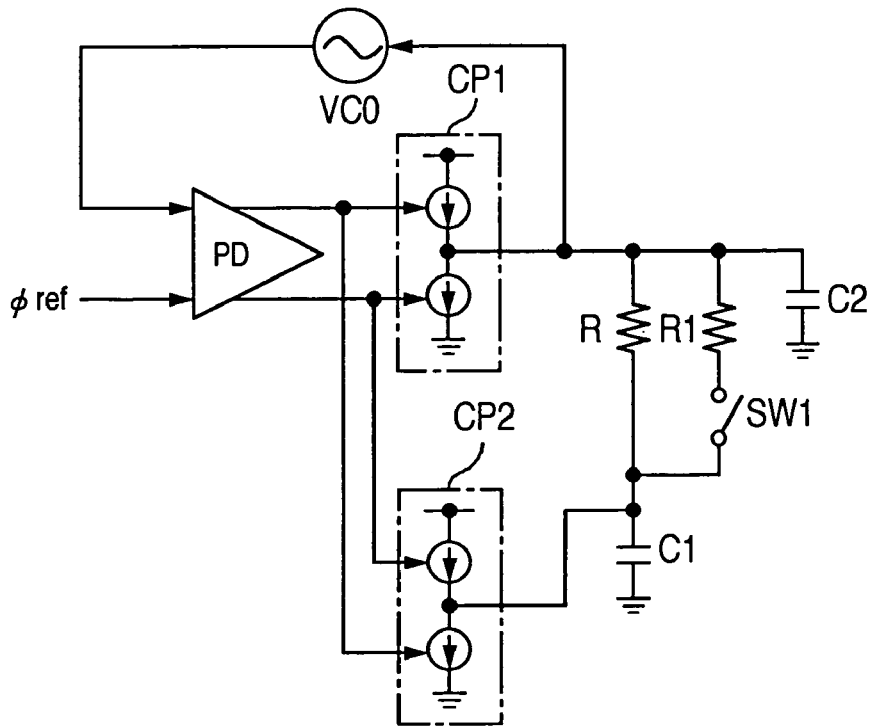
FIG. 7 is a circuit diagram illustrating an exemplary configuration of a loop filter according to another embodiment of the present invention, and a PLL loop which employs this loop filter.

The embodiment illustrated in FIG. 7 comprises a series connection of a resistor R1 and a switch SW1 in parallel with the resistor R in the embodiment of FIG. 6. The switch SW1 is temporarily turned on by a control signal upon start of the VCO. Though not apparent in FIG. 7, the current sources associated with the charge pumps CP1, CP2 are also controlled by the control signals to increase their current values. The switch SW1 is turned off after the PLL is locked up, and the current values of the current sources associated with the charge pumps CP1, CP2 are also returned to normal values. For scaling up/down the current values of the current sources associated with the charge pumps CP1, CP2, an auxiliary current source and switch, for example, may be provided in parallel with a reference current source, such that the switch is turned on/off to change the current value.

By temporarily turning on the switch SW1 within the loop filter upon start of the VCO in the foregoing manner, the capacitors C1, C2 can be rapidly charged to speed up the pull-in of the PLL. It should be noted that the switch SW1 alone could be disposed in parallel with the resistor R only for purposes of speeding up the pull-in of the PLL, but this may reduce a phase margin to result in oscillations. For this reason, the resistor R1 is additionally disposed in series with the switch SW1 to ensure a sufficient phase margin. In addition, a plurality of sets of the switch SW1 and resistor R1 may be provided in parallel with the resistor R to correct a discrepancy in the characteristic of the filter due to variations in the course of manufacturing and the like.

Figure 8:
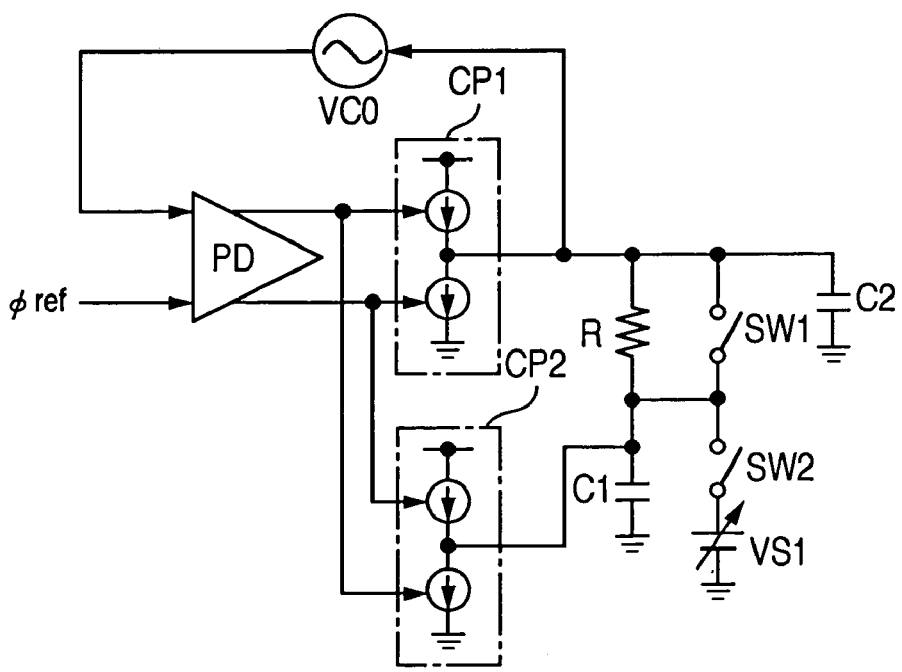
FIG. 8 is a circuit diagram illustrating an exemplary configuration of a loop filter according to a further embodiment of the present invention, and a PLL loop which employs this loop filter.

On the other hand, the embodiment in FIG. 8 additionally provides a switch SW1 in parallel with the resistor R, and a switch SW2 and a regulated voltage source VS1 in parallel with the capacitor C1 in the embodiment of FIG. 6. These switches SW1, SW2 are temporarily turned on before the VCO is started, and turned off after the PLL is locked up by the associated control signals. A voltage selected for the regulated voltage source VS1 is close to a VCO control voltage which corresponds to a frequency at which the PLL is locked.

In the embodiment of FIG. 8, since the VCO is started with a control voltage terminal of the VCO applied with a voltage which is supposed to be applied when the PLL is locked, the PLL can be more rapidly pulled in than when the voltage applied to the control voltage terminal is gradually increased from zero volt.

Figure 9:
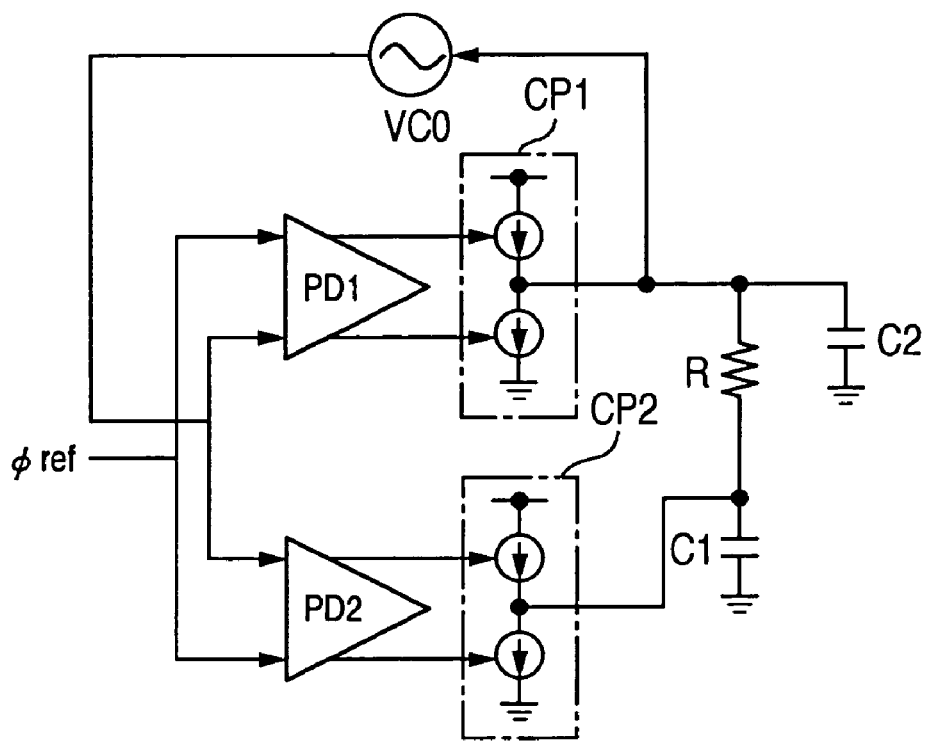
FIG. 9 is a circuit diagram illustrating another exemplary configuration of a PLL loop which employs a loop filter according to one embodiment of the present invention.

FIG. 9 illustrates an exemplary modification to the PLL which employs the loop filter of the foregoing embodiment.

In the PLL in the embodiments of FIGS. 7 and 8, the charge pumps CP1, CP2 for charging and discharging the capacitors of the loop filter is controlled by the signals from the single phase comparator PD. In such a configuration, since the distance from the phase comparator PD to the charge pump CP1 differs from the distance from the phase comparator PD to the charge pump CP2, there is a difference between signal delay times of the two parts, which causes a discrepancy between the switching timing of the charge pump CP1 and the switching timing of the charge pump CP2, possibly resulting in unwanted spurious.

To address this problem, in the embodiment of FIG. 9, a phase comparator PD2 is provided for controlling the charge pump CP2 separately from the phase comparator PD1 for controlling the charge pump CP1, so that the signal delay amounts can be individually adjusted. In this way, the switching timing of the charge pump CP1 can be matched with the switching timing of the charge pump CP2 to prevent the unwanted spurious.

Second Embodiment

Figure 10:
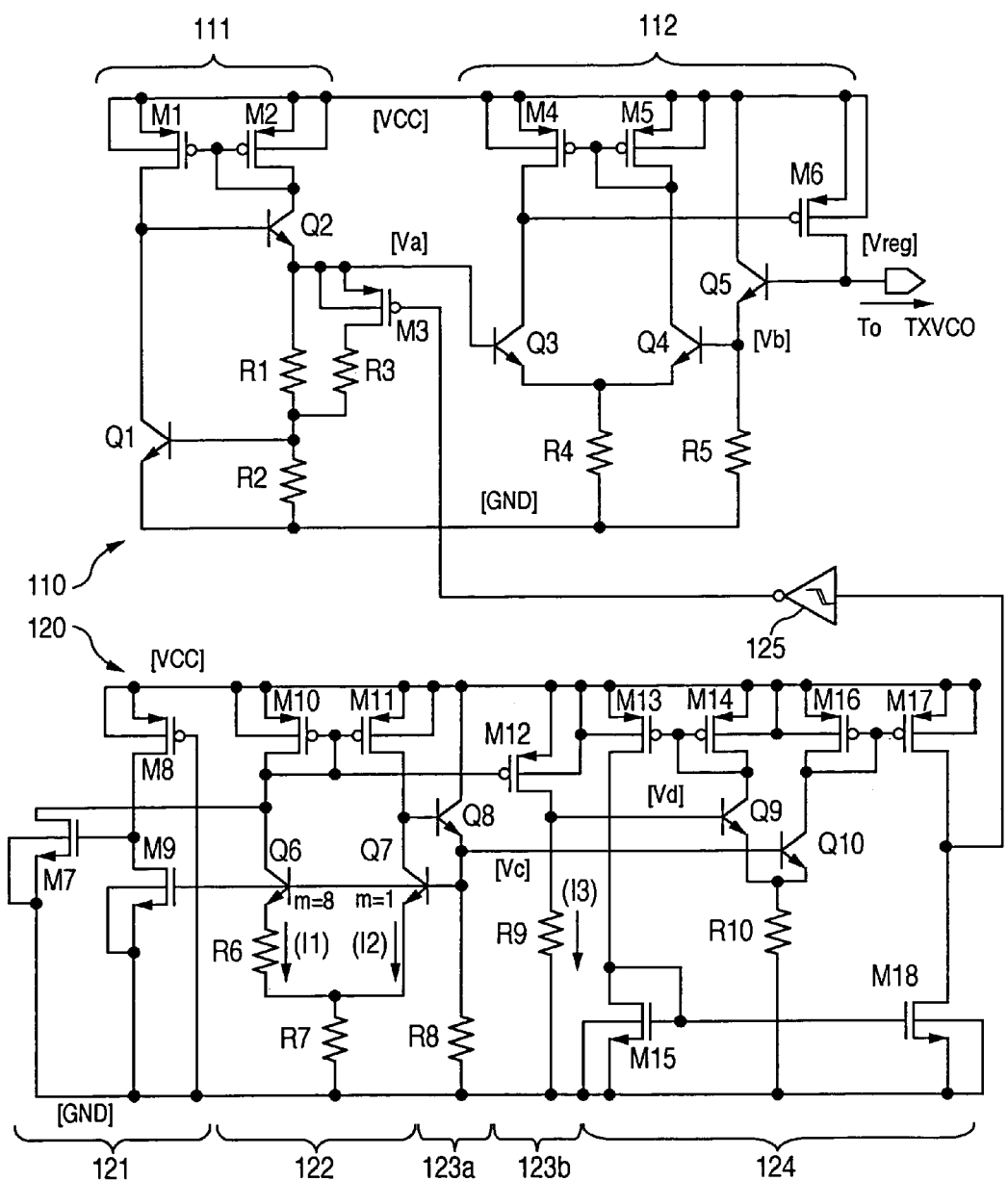
FIG. 10 is a circuit diagram illustrating one embodiment of a voltage regulator for supplying a supply voltage to a transmission oscillator circuit (TXVCO)

Generally, the voltage controlled oscillator (VCO) suffers from a varying oscillation frequency as the supply voltage fluctuates. To prevent the varying oscillation frequency, the present invention supplies a transmission oscillator circuit (TXVCO) with a supply voltage from a voltage regulator. FIG. 10 illustrates one embodiment of a voltage regulator for supplying a transmission oscillator circuit (TXVCO) with a supply voltage.

The voltage regulator illustrated in FIG. 10 comprises a regulator unit 110 for generating a desired supply voltage using a base-emitter voltage Vbe of a bipolar transistor; and a temperature detector unit 120 for generating a control signal to the regulator unit 110. Conventional voltage regulators typically have a band gap reference circuit. The use of the band gap reference circuit permits the voltage regulator to generate a stable supply voltage without source voltage dependency regardless of changes in temperature. However, in a particular voltage regulator for generating a supply voltage which is supplied to a charge pump that forms part of a transmission oscillator circuit or a transmission PLL, noise generated in the band gap reference circuit is transferred to the transmission oscillator circuit or charge pump through the generated voltage, causing a lower CN ratio.

In the voltage regulator of the embodiment illustrated in FIG. 10, since the regulator unit 110 does not include a band gap reference circuit, no noise will be transferred to the transmission oscillator circuit or charge pumps through a generated voltage. While the temperature detector unit 120 is provided with a voltage regulator circuit which comprises a band gap reference circuit, the temperature detector unit 120 utilizes the band gap reference circuit for generating the control signal which turns on/off a MOS switch within the regulator unit 110 to switch a generated voltage, so that noise generated by the band gap reference circuit will not be transferred to the transmission oscillator circuit or charge pumps. Consequently, in a PLL circuit having a transmission oscillator circuit and charge pumps which is operated with a voltage generated by the voltage regulator, it is possible to prevent an increased phase error and increased side-band spurious.

The regulator unit 110 is made up of a voltage regulator circuit 111 which comprises MOS transistors M1, M2 having their source terminals connected to a supply voltage terminal Vcc and their gates coupled to each other to form a current mirror circuit; a bipolar transistor Q1 connected in series with the MOS transistor M1; a bipolar transistor Q2 connected in series with the MOS transistor M2; and resistors R1, R2, and a voltage converter circuit 112 using a differential amplifier.

In the voltage regulator circuit 111, the transistor Q1 has a collector connected to a base of the transistor Q2, and a base applied with a voltage divided by the resistors R1, R2 connected in series with the transistor Q2. Thus, the voltage regulator circuit 111 generates a regulated voltage Va which is determined by the base-emitter voltage Vbe of the transistor Q1 and the ratio of the resistors R1, R2. In addition, a series connection of a switch MOS transistor M3 and a resistor R3 is connected in parallel with the resistor R1, such that the generated voltage Va is switched in two steps in accordance with an on- or off-state of the switch MOS transistor M3.

The voltage converter circuit 112 comprises a pair of differential input transistors Q3, Q4; a resistor R4 connected between a common emitter of the transistors Q3, Q4 and a ground point; active load MOS transistors M4, M5 connected to collectors of the transistors Q3, Q4, respectively; an output transistor M6 having a gate terminal connected to the collector of one differential input transistor Q3; and a transistor Q5 and a resistor R6 connected in series between the supply voltage Vcc and ground point. The transistor Q5 is applied with an output voltage Vreg at the base terminal, while the differential input transistor Q3 is applied with the regulated voltage Va generated by the voltage regulator circuit 111 at the base terminal, and an emitter voltage of the transistor Q5 is fed back to the base terminal of the other differential input transistor Q4, so that the voltage converter circuit 112 operates in such a manner that the emitter voltage Vb of the transistor Q5 matches the regulated voltage Va from the voltage regulator circuit 111.

The voltages Va, Vb, Vreg generated by the appropriate components in the voltage regulator of FIG. 10 are expressed as follows:

$$Va = \{(r1+r2)/r2\} \times VbeQ1$$

$$Vb = Va - VbeQ3 + VbeQ4 \approx Va$$

$$Vreg = Vb + VbeQ5$$
$$= Va + VbeQ5$$
$$= \{(r1+r2)/r2\} \times VbeQ1 + VbeQ5$$

where r1, r2 represent the resistance values of the resistors R1, R2; and VbeQ1, VbeQ3, VbeQ4, VbeQ5 represent the base-emitter voltages of the bipolar transistors Q1, Q3, Q4, Q5, respectively.

Further, when VbeQ1=VbeQ5 stands, the foregoing equation can be transformed as follows supposing that VbeQ1=VbeQ5=Vbe stands:

$$Vreg = \{(r1+2 \cdot r2)/r2\} \times Vbe$$

It can be understood from this equation that the voltage regulator of FIG. 10 can generate a voltage which is determined by the base-emitter voltage Vbe of the bipolar transistor and the resistance ratio of the resistors R1, R2. As is well known, the base-emitter voltage Vbe of the bipolar transistor has a negative temperature characteristic. Therefore, the output voltage Vreg generated by the voltage regulator of FIG. 10 would fluctuate following a change in temperature unless appropriate actions were taken therefor (Vreg is lower as the temperature is higher).

In the embodiment of FIG. 10, to address fluctuations in the output voltage Vreg, a series connection of the switch MOS transistor M3 and resistor R3 is connected in parallel with the resistor R1 of the voltage regulator circuit 111, such that the generated voltage Va is switched in two steps in accordance with an on- or off-state of the switch MOS transistor M3. In response to the voltage Va switched in two steps, the voltage regulator also switches the output voltage Vreg in steps in accordance with the on- or off-state of the switch MOS transistor M3.

Specifically, as the switch MOS transistor M3 is turned on, which is equivalent to a reduction in the resistance value r1 of the resistor R1 in the aforementioned equation which expresses the output voltage Vreg, the voltage Va is reduced so that the voltage regulator generates a lower output voltage Vreg. Therefore, the switch MOS transistor M3 is turned on at lower than a proper temperature Tc to reduce the output voltage Vreg, while the switch MOS transistor M3 is turned off at the proper temperature Tc or higher to increase the output voltage Vreg.

Figure 11:
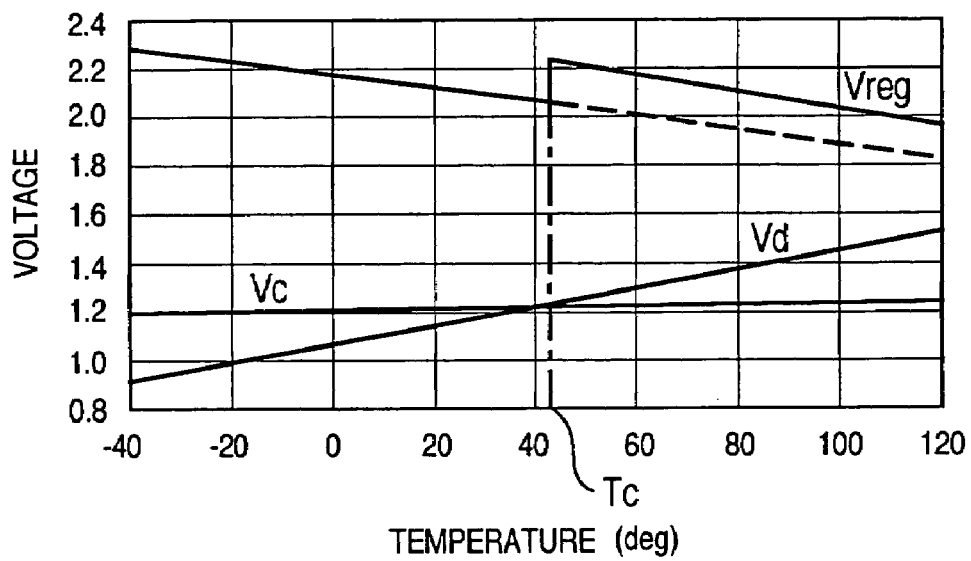
FIG. 11 is a temperature characteristic graph showing a voltage outputted from the voltage regulator in the embodiment of FIG. 10, and the temperature dependency of the potential at an internal node within a temperature detector circuit.

In this way, the output voltage Vreg of the voltage regulator can be controlled to decrease as the temperature becomes higher, once rise up at the temperature Tc at one step, and again gradually decrease, as indicated by a solid line in FIG. 11. As a result, by changing the output voltage Vreg through the switching of the switch MOS transistor M3, it is possible to reduce the amount of fluctuations in the output voltage Vreg of the voltage regulator with respect to the temperature. If the switch MOS transistor M3 is not switched, the output voltage Vreg of the voltage regulator will be largely reduced as the temperature rises, as indicated by a broken line in FIG. 11.

The temperature detector unit 120 in the voltage regulator of FIG. 10 is provided for generating a signal for switching the switch MOS transistor M3.

The temperature detector unit 120 in this embodiment comprises a bias circuit 121 composed of MOS transistors M7–M9; a differential circuit 122 composed of bipolar transistors Q6, Q7, which differ in the emitter size from each other, current mirror MOS transistors M10, M11 for supplying collector currents to the bipolar transistors Q6, Q7, respectively, and resistors R6, R7 connected between emitters of the bipolar transistors Q6, Q7 and a ground point; an emitter follower circuit 123a composed of a bipolar transistor Q8 for applying a current in accordance with a collector voltage of the bipolar transistor Q7, and a resistor R8; a source follower circuit 123b composed of a MOS transistor M12 for applying a current in accordance with a collector voltage of the bipolar transistor Q6, and a resistor R9; and a voltage comparator circuit 124 composed of bipolar transistors Q9, Q10 which are applied with a drain voltage of the MOS transistor M12 and an emitter voltage of the bipolar transistor Q8, respectively, at their bases, and have their emitters coupled to each other to perform a differential operation, current mirror MOS transistors M13–M17 which are connected to collectors of the bipolar transistors Q9, Q10, and MOS transistors M17, M18 which are connected in series with the MOS transistors M13, M17 and have their gate terminals connected to each other to form a current mirror; and an inverter circuit 125 which has a hysteresis characteristic. The transistors Q6, Q7 in the temperature detector circuit 122 are set such that the former has an emitter size eight times larger than the latter.

In the temperature detector circuit 122 in FIG. 10, the following equations are derived:

$$I1 = (VbeQ7 - VbeQ6)/r6$$

$$Vc = (I1 + I2) \cdot r7 + VbeQ7$$

$$Vd = I3 \cdot r9$$

where I1, I2 represent collector currents flowing into the bipolar transistors Q6, Q7, respectively; Vc represents a voltage at the emitter of the bipolar transistor Q8; Vd represents a drain voltage of the MOS transistor M12; I3 represents a current flowing through the resistor R9; and r6, r7, r9 are resistance values of the resistors R6, R7, R9, respectively.

Assuming herein that the MOS transistors M10, M11, M12 connected to form a current mirror have the same size, I1=I2=I3 is established. In this event, paying attention to the bipolar transistors Q6, Q7, VbeQ7=VbeQ6+I1·r6 is established. From this equation, the corrector current I1 of the bipolar transistor Q6 is expressed by I1=(VbeQ7−VbeQ6)/r6. Therefore, the voltages Vc, Vd are transformed as expressed by the following equations:

$$Vc = 2I1 \cdot r7 + VbeQ7 \quad \text{Equation 3.1}$$
$$= \{2(VbeQ7 - VbeQ6) \cdot r7 / r6\} + VbeQ7$$

$$Vd = (VbeQ7 - VbeQ6) \cdot r9/r6 \quad \text{Equation 3.2}$$

The base-emitter voltages VbeQ6, VbeQ7 of the bipolar transistors Q6, Q7 have negative temperature characteristics. Moreover, in this embodiment, the bipolar transistors Q6, Q7 are set to have the emitter sizes in the ratio of 8:1. Therefore, the absolute values of their base-emitter voltages are in a relationship expressed by |VbeQ6|<|VbeQ7|. From this relationship, (VbeQ7−VbeQ6) in the foregoing Equation 3.2 is positive. In conclusion, a temperature coefficient of the voltage Vc can be brought closer to zero if the resistance values r6, r7 of the resistors R6, R7 are set such that the absolute value of a temperature coefficient in the first term is equal to the absolute value of a temperature coefficient in the second term.

On the other hand, it can be understood from Equation 3.2 that a temperature coefficient of the voltage Vd can be adjusted by changing a resistance ratio r9/r6 of the resistors R6 and R9.

In the temperature detector circuit in this embodiment, the resistance values r6, r7 are appropriately set for the resistors R6, R7 to bring the temperature coefficient of the voltage Vc closer to zero, and the resistance ratio r9/r6 is appropriately adjusted for the resistors R6, R9 such that the voltages Vc, Vd intersect near 40° C., as shown in FIG. 11.

The voltage comparator circuit 124 compares the voltages Vd, Vc, and changes its output voltage if Vd is higher than Vc, causing the output of the inverter 125 to transition to a high level which turns off the switch MOS transistor M3 in the regulator unit 110. The resistance ratio r9/r6 can be changed for the resistors R6, R9 to arbitrarily set a temperature at which the switch MOS transistor M3 switches from on-state to off-state.

It should be noted that the temperature detector unit 120 in this embodiment can suffer from noise generated in the temperature detector circuit 122, but the noise, if any, will be blocked by the inverter 125, and therefore will never be transferred to the voltage regulator unit 110. It is therefore possible to prevent a degradation in the characteristic of a circuit which operates with the voltage generated by the voltage regulator. In addition, the voltage comparator circuit 124 may be provided with a hysteresis characteristic to prevent the switch MOS transistor M3 from repeatedly turning on and off due to fluctuations in temperature.

Figure 12:
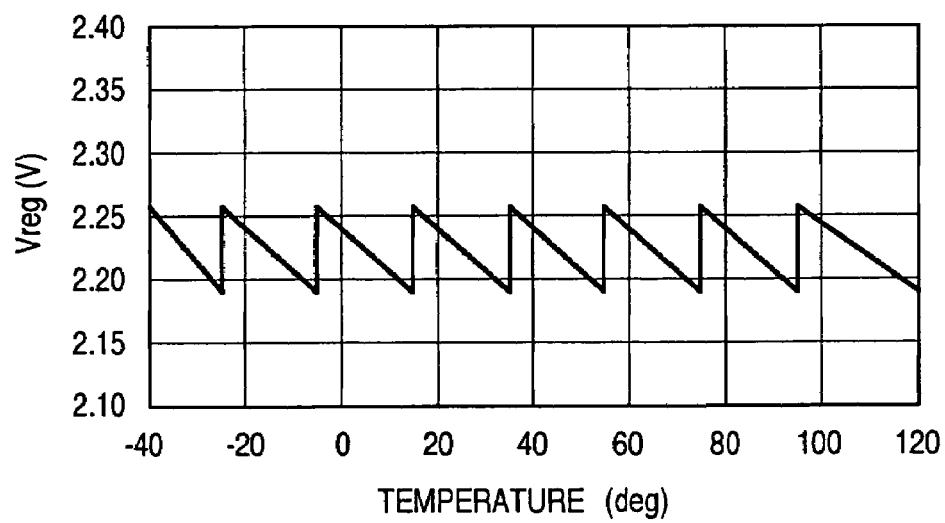
FIG. 12 is a temperature characteristic graph showing the temperature dependency of the output voltage in an exemplary modification to the voltage regulator in FIG. 10.

The foregoing embodiment has been described in connection with a circuit which is configured to switch the voltage generated by the voltage regulator in two steps in accordance with the temperature. Alternatively, the regulator unit 110 in FIG. 10 may comprise a plurality of sets of the switch MOS transistor M3 and resistor R3, and the temperature detector unit 120 may comprise a plurality of sets of the source follower circuit 123b composed of the MOS transistor M12 and resistor R9, and the comparator circuit 124 composed of a pair of the differential transistors Q9, Q10, to switch the voltage generated by the voltage regulator in multiple steps, for example, as illustrated in FIG. 12, in accordance with the temperature.

Figure 13:
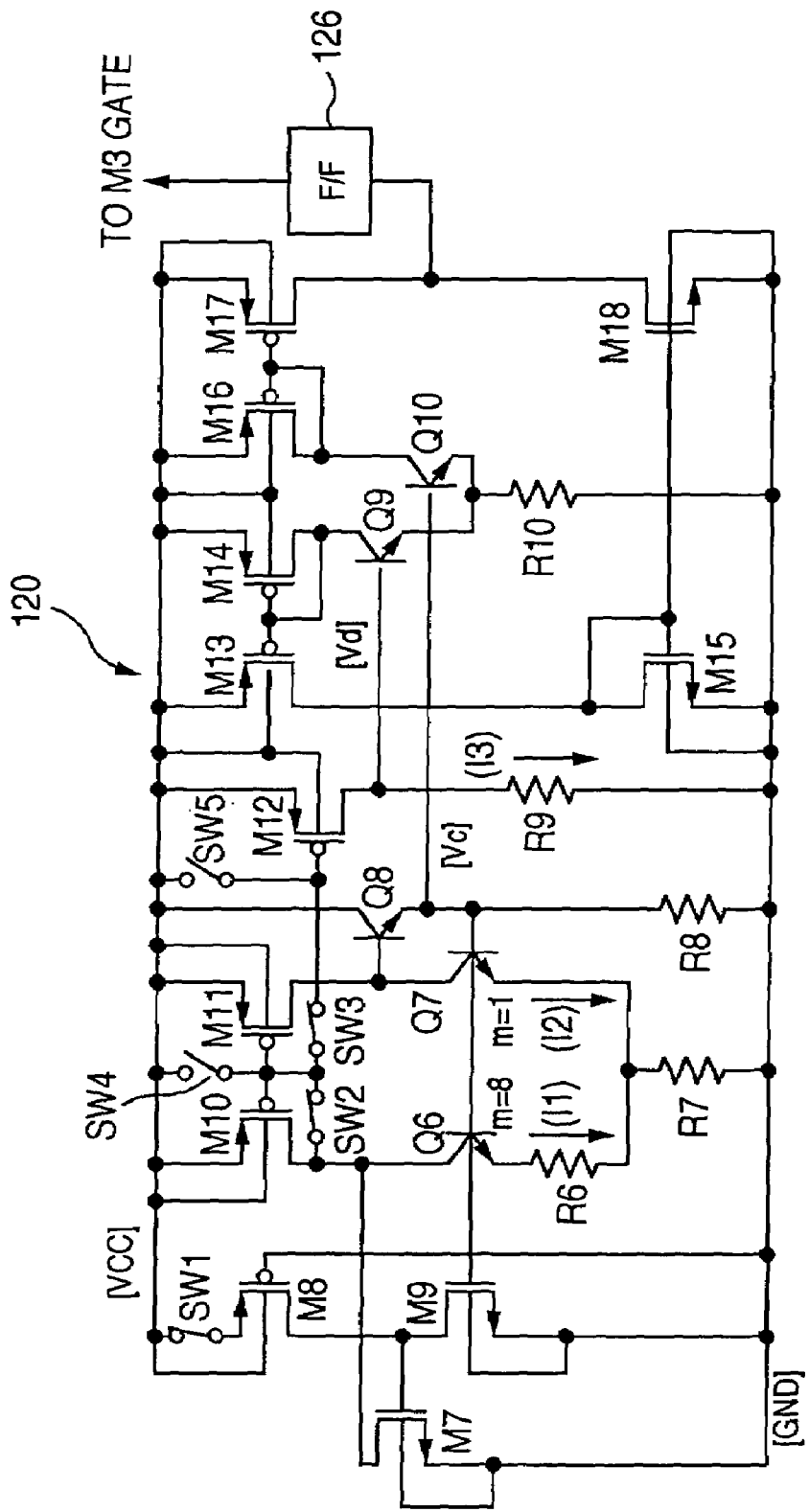
FIG. 13 is a circuit diagram illustrating another exemplary configuration of a temperature detector of the voltage regulator in the embodiment of FIG. 10.

FIG. 13 illustrates an exemplary modification to the voltage regulator according to the second embodiment. This modified voltage regulator comprises normal-on switching elements SW1, SW2, SW3 connected between the source terminal of the MOS transistor M8 and the supply voltage terminal Vcc, between the gate and drain of the MOS transistor M10, and between the gate terminals of the MOS transistors M10 and M12, and normal-off switching elements SW4, SW5 connected between the gate terminals of the MOS transistors M10, M11 and the supply voltage terminal Vcc, and between the gate terminal of the MOS transistor M12 and the supply voltage terminal Vcc, respectively, in the temperature detector unit 120. With the provision of these switching elements SW1-SW5, the temperature detector circuit 120 is operated only when temperature information is required, such as upon start of the PLL circuit, and is otherwise made inoperative to save the power consumption. The normal-off switching elements SW4, SW5 are provided for preventing a through current from flowing through the circuit due to a floating potential state at an internal node in the circuit during an inoperative state.

Also, in this modified voltage regulator, the inverter circuit 125 in the embodiment of FIG. 10 is replaced with a flip-flop 126 for latching the output of the temperature detector circuit 120. This flip-flop 126 latches the output of the temperature detector circuit 120 immediately before the VCO is started, so that the VCO can be obviated from instable operations caused by variations in the output of the temperature detector circuit 120 after the start of the VCO due to fluctuations in temperature.

Third Embodiment

Figure 14:
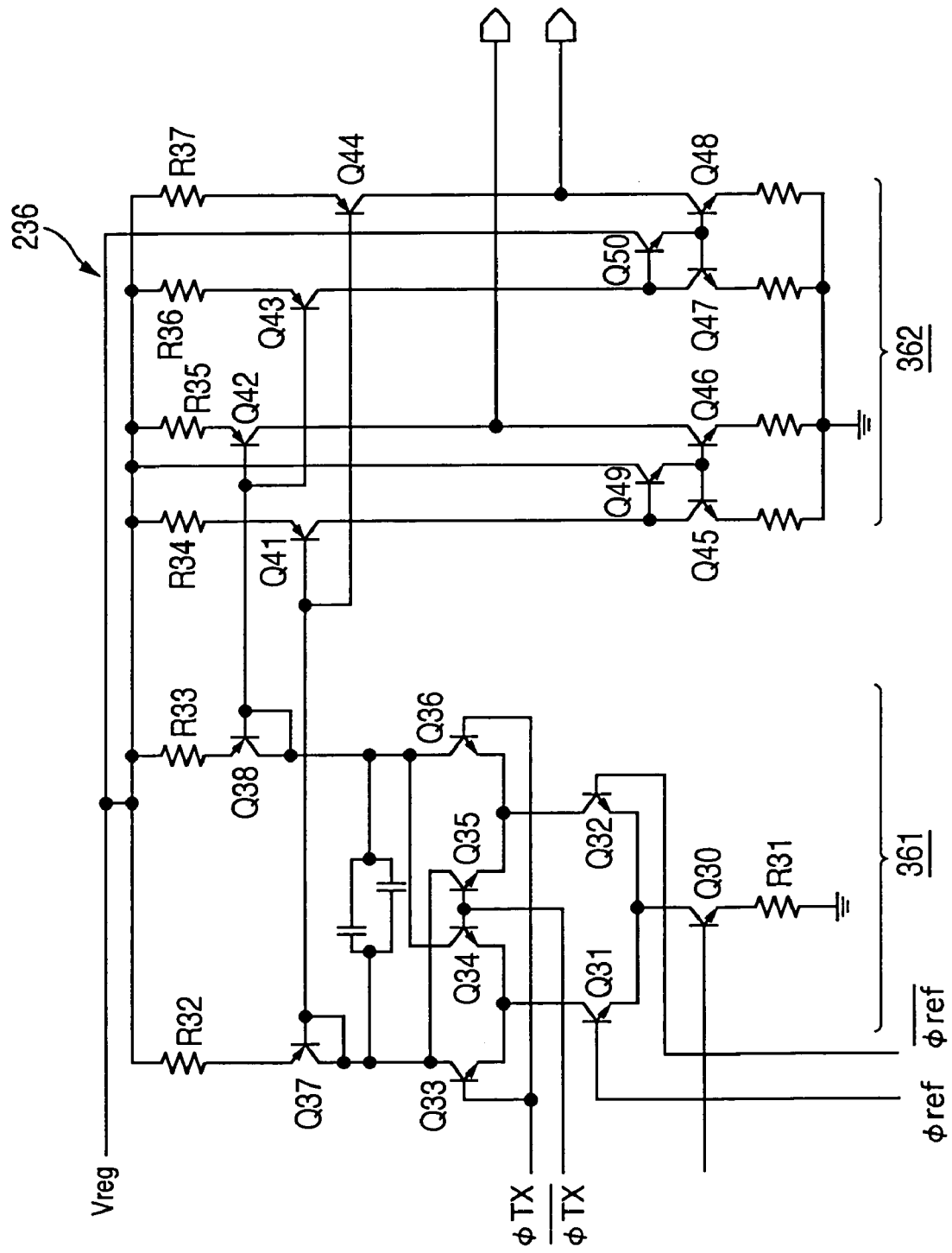
FIG. 14 is a circuit diagram illustrating one embodiment of a phase comparator circuit which operates with a voltage applied from the voltage regulator in the foregoing embodiment.

FIG. 14 illustrates one embodiment of a phase comparator circuit which is applied with the voltage from the voltage regulator in the foregoing embodiment for operations. The phase comparator circuit 236 in this embodiment comprises a signal comparator unit (left-hand side circuit) 361 and an output unit (right-hand side circuit) 362. As illustrated in FIG. 14, the signal comparator unit 361 comprises a cascaded configuration of differential circuits, wherein a current regulating transistor Q30 is connected to emitters of a lower differential transistor pair Q31, Q32, and differential transistor pairs Q33, Q34 and Q35, Q36 are connected to collectors of the lower differential transistor pair Q31, Q32. The transistors Q33, Q35 have their collectors coupled to each other, which are then connected to a common load transistor Q37. Likewise, the transistors Q34, Q36 also have their collectors coupled to each other, which are connected to a common load transistor Q38.

In this embodiment, differential reference signals φref, /φref are applied to base terminals of the lower differential transistor pair Q31, Q32, respectively, while a signal φTX from the VCO is applied to base terminals of the transistors Q33, Q36, and a signal /φTX having the phase opposite to that of the signal φTX is applied to base terminals of the transistors Q34, Q35 in the upper differential transistor pairs Q33–Q36, so that the transistors Q33–Q36 generate voltages at their collectors in accordance with a phase difference between φref and φTX.

The output unit 362 comprises transistors Q41, Q44 connected in a current mirror configuration with the load transistor Q37 in the signal comparator unit; transistors Q42, Q43 connected in a current mirror configuration with the load transistor Q38; transistors Q45–Q48 connected in series with the transistors Q41–44, respectively; and transistors Q49, Q50 for applying bias voltages to base terminals of the transistors Q45, Q46 and Q47, Q48, respectively. The transistors Q45, Q46 have their bases connected in common, the transistors Q47, Q48 also have their bases connected in common, the transistors Q49, Q50 have their collectors connected to a supply voltage terminal, and their bases connected to collectors of Q41, Q43, respectively, such that bias voltages are applied from an emitter of the transistor Q49 to the common base of the transistors Q45, Q46, and from an emitter of the transistor Q50 to the common base of the transistors Q47, Q48, respectively.

In the phase comparator circuit of this embodiment, the transistors Q41, Q44 and transistors Q42, Q43 are respectively set to have their emitter sizes in a ratio of 10:9. The transistors Q45, Q46 have the same emitter size, and the transistors Q47, Q48 also have the same emitter size. Consequently, the transistors Q44, Q48 are applied with 9/10 of a current applied to the transistors Q42, Q46.

Further, the transistor Q48 is applied at its base with a signal in phase with a signal applied to a base of the transistor Q42, while the transistor Q44 is applied at its base with a signal in phase with a signal applied to a base of the transistor Q41, so that the pairs of transistors Q42, Q48 and Q46, Q44 are controlled in phase, respectively. Thus, the transistor Q42 corresponds to the regulated current source I11, while the transistor Q46 corresponds to the regulated current source I12 in FIG. 6. Also, the transistor Q44 corresponds to the regulated current source I21, while the transistor Q48 corresponds to the regulated current source I22. The phase comparator circuit of the embodiment in FIG. 14 configured in the foregoing manner operates with a supply voltage which is the voltage Vreg supplied from the regulator unit 110 with less source voltage dependency and temperature dependency, allowing the regulated current sources to maintain consistent current values against fluctuations in the supply voltage and changes in temperature for charging and discharging a loop filter.

Fourth Embodiment

Figure 15:
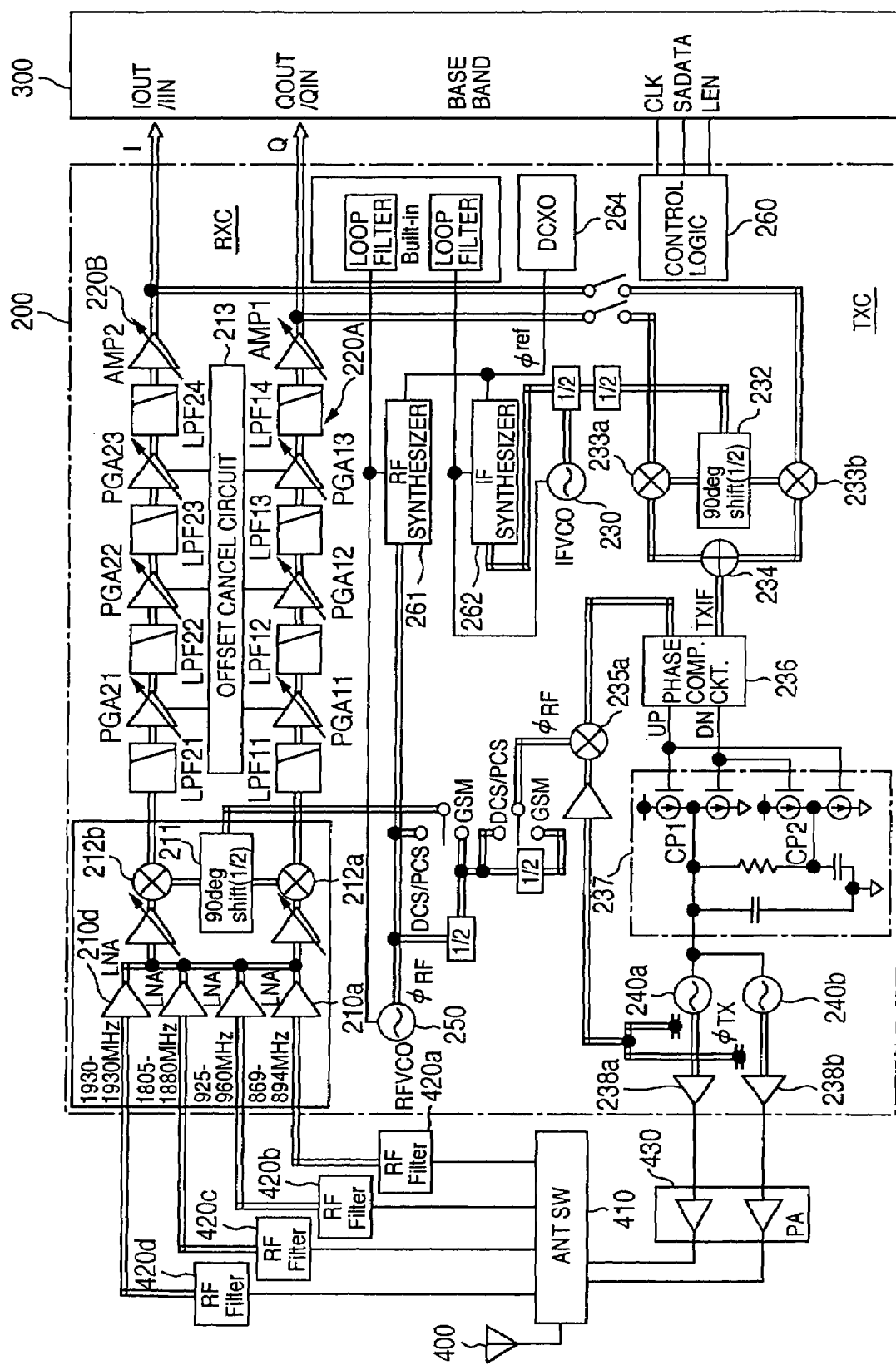
FIG. 15 is a block diagram illustrating an exemplary configuration of a radio communication system including a high frequency IC (RF-IC) which employs the PLL comprising the loop filter and phase comparator circuit in the foregoing embodiments for a transmission PLL.

Referring next to FIG. 15, description will be made on an exemplary configuration of a radio communication system including a high frequency IC (RF-IC) which employs the PLL comprising the loop filter and phase comparator circuit according to the foregoing embodiments for a transmission PLL.

As illustrated in FIG. 15, the radio communication system in this embodiment comprises an antenna 400 for transmitting and receiving signal radiowaves; a switch 410 for switching between a transmission and a reception mode; bandpass filters 420a–420d each comprised of a SAW filter for removing unwanted waves from a received signal, and the like; a high frequency power amplifier circuit (power module) 430 for amplifying a transmission signal; a high frequency IC 200 for demodulating a received signal and modulating a transmission signal; and a baseband circuit 300 for converting transmission data into I, Q signals and controlling the high frequency IC 200. In this embodiment, the high frequency IC 200 and baseband circuit 300 are implemented on separate semiconductor chips, respectively, as individual semiconductor integrated circuits.

Though not particularly limited, the high frequency IC 200 in this embodiment is configured to be capable of modulating and demodulating signals in four frequency bands conforming to the following communication schemes: GSM850 and GSM900, DCS1800, and PCS1900. Accordingly, the bandpass filters provided in the radio communication system include the filter 420a for passing therethrough a received signal in the frequency band of GSM 850; filter 420b for passing therethrough a received signal in the frequency band of GSM 900; filter 420c for passing therethrough a received signal in the frequency band of DCS 1800; and filter 420d for passing therethrough a received signal in the frequency band of PCS1900.

The high frequency IC 200 in this embodiment is generally divided into a reception-related circuit RXC; a transmission-related circuit TXC; and a control-related circuit which comprises circuits common to the transmission- and reception-related circuits such as a control circuit, a clock generator circuit, and the like.

The reception-related circuit RXC comprises low noise amplifiers 210a–210d for amplifying received signals in the respective frequency bands of GSM850, GSM900, DCS1800, and PCS1900, respectively; a frequency divider/ phase shifter circuit 211 for dividing a local oscillating signal φRF generated by a high frequency oscillator circuit (RFVCO) 250 and generating orthogonal signals which are 90° out of phase from each other; mixer circuits 212a, 212b for mixing received signals amplified by the low noise amplifiers 210a–210d with the orthogonal signals generated by the frequency divider/phase shifter circuit 211 to demodulate and downconvert an I-signal and a Q-signal; high gain amplifier units 220A, 220B common to the respective frequency bands for amplifying the demodulated I- and Q-signals for delivery to the baseband LSI 300; and an offset cancel circuit 213 for canceling input DC offsets of amplifiers in the high gain amplifier units 220A, 220B.

The high gain amplifier unit 220A comprises a plurality of low pass filters LPF11, LPF12, LPF13, LPF14 and gain control amplifiers PGA11, PGA12, PGA13 which are alternately connected in series; and an amplifier AMP1 connected at the final stage, and amplifies a demodulated I-signal to a predetermined amplitude level while removing unwanted waves. Likewise, the high gain amplifier unit 220B comprises a plurality of low pass filters LPF21, LPF22, LPF23, LFP24 and gain control amplifiers PGA21, PGA22, PGA23 which are alternately connected in series; and an amplifier AMP2 connected at the final stage, and amplifies a demodulated Q-signal to a predetermined amplitude level.

The offset cancel circuit 213 comprises A/D converter circuits (ADC) provided in correspondence to the respective gain control amplifiers PGA11–PGA23 for converting output potential differences of the gain control amplifiers PGA11–PGA23 when their input terminals are short-circuited; D/A converter circuits (DAC) each for generating an input offset voltage based on the result of the conversion made by an associated A/D converter, such that the resulting input offset voltage reduces a DC offset to zero in the output of the corresponding gain control amplifier PGA11–PGS23, and applying the generated input offset voltage to a differential input of the corresponding gain control amplifier; and a control circuit for controlling the A/D converter circuits (ADC) and D/A converter circuits (DAC) to perform an offset cancel operation.

The transmission-related circuit TXC comprises an oscillator circuit (IFVCO) 230 for generating an oscillating signal φIF at an intermediate frequency such as 640 MHz, for example; a phase shifter/frequency divider circuit 232 for dividing the oscillating signal φIF generated by the oscillator circuit 230 and generating orthogonal signals which are 90° out of phase from each other; modulator circuits 233a, 233b each comprised of a mixer for modulating the generated orthogonal signal with the I-signal or Q-signal supplied from the baseband circuit 300; an adder 234 for adding the modulated signals; transmission oscillator circuits (TXVCO) 240a, 240b each for generating a transmission signal φTX at a predetermined frequency; an offset mixer 235a for synthesizing a feedback signal which is the transmission signal φTX outputted from the transmission oscillator circuit 240a, 240b, extracted by a coupler or the like, with a signal φRF' divided from the oscillating signal φRF generated by the high frequency oscillator circuit (RFVCO) 250 to generate a signal at a frequency corresponding to a difference in frequency between the two signals; a phase comparator circuit 236 for comparing the output of the offset mixer 235a with a signal TXIF resulting from the synthesis in the adder 234 to detect a frequency difference and a phase difference; a charge pump/loop filter 237 for generating a voltage in accordance with the output of the phase detector circuit 236; and buffer circuits 238a, 238b each for converting differential outputs of the associated TXVCO 240a, 240b into a single signal for delivery to the outside.

One of the transmission oscillator circuits 240a, 240b generates a signal in a band from 850 to 900 MHz for GSM, and the other generates a signal in a band from 1800 to 1900 MHz for DCS and PCS.

The high frequency IC chip 200 in this embodiment further comprises a control circuit 260 for controlling the overall chip; an RF synthesizer 261 which makes up an RF PLL circuit together with the high frequency oscillator circuit (RFVCO) 250; an IF synthesizer 262 which makes up an IF PLL circuit together with the intermediate frequency oscillator circuit (IFVCO) 230; and a reference oscillator circuit (TCXO) 264 for generating a clock signal φref which serves as a reference signal for these synthesizers 261, 262. The synthesizers 261, 262 are each composed of a phase comparator circuit, a charge pump, a loop filter, and the like.

Since the reference oscillating signal φref is required to be accurate in frequency, an external quartz vibrator is connected to the reference oscillator circuit 264. The frequency selected for the reference oscillating signal φref may be 26 MHz or 13 MHz. This is because quartz vibrators at such frequencies are general purpose parts and are readily available on the market.

The control circuit 260 comprises a control register which is set based on a signal from the baseband IC 300. Specifically, the high frequency IC 200 is supplied with a clock signal CLK for synchronization, a data signal SDATA, and a load enable signal LEN as a control signal from the baseband IC 300. As the load enable signal LEN is asserted to a valid level, the control circuit 260 sequentially captures the data signal SDATA transmitted thereto from the baseband IC 300 in synchronism with the clock signal CLK, and sets the captured data signal SDATA into the control register. Though not particularly limited, the data signal SDATA may be transmitted in series. The baseband IC 300 may be based on a microprocessor or the like. The data signal SDATA includes a command issued from the baseband IC 300 to the high frequency IC 200.

In this embodiment, the phase detector circuit 236, charge pump/loop filter 237, transmission oscillator circuits (TX-VCO) 240a, 240b, and offset mixer 235 make up a transmission PLL circuit (TXPLL) for performing a frequency conversion. In the multi-band type radio communication system according to this embodiment, the control circuit 260 changes the frequency φRF of the oscillating signal from the high frequency oscillator circuit 250 in accordance with a particular channel in use, and changes the frequency of a signal supplied to the offset mixer 235a in accordance with a GSM mode or a DCS/PCS mode to switch the transmission frequency, for example, in response to a command from the baseband IC 300 during transmission and reception.

On the other hand, different values are set for the oscillation frequency of the high frequency oscillator circuit (RFVCO) 250 in the reception mode and transmission mode, respectively. In the transmission mode, the oscillation frequency fRF of the high frequency oscillator circuit (RFVCO) 250 is set, for example, in a range of 3,616 to 3,716 MHz for GSM850, in a range of 3,840 to 3,980 MHz for GSM900, in a range of 3,610 to 3,730 MHz for DCS, or in a range of 3,860 to 3,980 MHz for PCS. Then, the frequency divider circuit divides the oscillation frequency fRF by four for GSM, or by two for DCS and PCS, and the resulting oscillation frequency is supplied to the offset mixers 235a, 235b.

The offset mixer 235a outputs a signal which corresponds to a difference in frequency between the oscillating signal φRF from the RFVCO 250 and the transmission oscillating signal φTX from the transmission oscillator circuits (TX-CVO) 240a, 240b (fRF-fTX), and the transmission PLL (TXPLL) operates such that this difference signal matches the modulated signal TXIF in frequency. Stated another way, the TXVCOs 240a, 240b are controlled to oscillate at a frequency which corresponds to the difference in frequency between the oscillating signal φRF from the RFVCO 250 (fRF/4 for GSM, and fRF/2 for DCS and PCS) and the modulated signal TXIF.

While the invention created by the inventors has been described in specific manner with reference to several embodiments thereof, it should be understood that the present invention is not limited to the foregoing embodiments but can be modified in various manners without departing from the spirit and scope of the invention. For example, while the foregoing embodiments have been described in connection with a second-order loop filter to which the present invention is applied, the present invention can be applied as well to a third-order loop filter.

In the foregoing description, the present invention made by the inventors has been discussed mainly in connection with a transmission PLL which forms part of a radio communication system, and a high frequency IC which contains the transmission PLL, which belong to the field of utilization that underlies the invention. The present invention, however, is not limited to the foregoing, but can be widely utilized in RF-PLL, IF-PLL, and general semiconductor circuits which contain a PLL circuit.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A semiconductor integrated circuit having a built-in PLL circuit, said PLL circuit including:
   a voltage controlled oscillator circuit;
   a phase comparator circuit for comparing an oscillating signal generated by said voltage controlled oscillator circuit with a reference signal in phase to generate a first signal and a second signal in accordance with a difference in phase between the oscillating signal and the reference signal;

a charge pump circuit configured to operate in response to the first signal and the second signal generated by said phase comparator circuit;

a loop filter having capacitive elements charged and discharged by said charge pump circuits; and a voltage regulator including a bipolar transistor for generating a base-emitter voltage as a reference for a predetermined voltage generated by said voltage regulator, a first resistive element connected in series with said bipolar transistor, a series connection of a second resistive element and a switching element connected in parallel with said first resistive element, and a temperature detector circuit for detecting a temperature to generate an output for controlling said switching element to switch the voltage generated by said voltage regulator in accordance with the detected temperature, wherein said voltage controlled oscillator circuit is configured to operate with the predetermined voltage generated by said voltage regulator.

2. A semiconductor integrated circuit having a built-in PLL circuit according to claim 1, wherein said voltage regulator comprises a plurality of sets of the series connection of said second resistive element and said switching element connected in parallel with said first resistive element.

3. A semiconductor integrated circuit having a built-in PLL circuit according to claim 1, wherein said voltage regulator further comprises a circuit having a hysteresis characteristic for communicating the output of said temperature detector circuit to a control terminal of said switching element.

4. A semiconductor integrated circuit having a built-in PLL circuit according to claim 1, wherein said voltage regulator further comprises a latch circuit for latching the output of said temperature detector circuit.

5. A semiconductor integrated circuit having a built-in PLL circuit according to claim 1, wherein said temperature detector circuit includes a switching element capable of shutting off an internal current path, and said temperature detector circuit is made inoperative when said switching element shuts off the current path.

6. A semiconductor integrated circuit having a built-in PLL circuit, said PLL circuit including:

a voltage controlled oscillator circuit;

a phase comparator circuit for comparing an oscillating signal generated by said voltage controlled oscillator circuit with a reference signal in phase to generate a first signal and a second signal in accordance with a difference in phase between the oscillating signal and the reference signal;

a first charge pump circuit and a second charge pump circuit configured to operate in response to the first signal and the second signal generated by said phase comparator circuit, each of said first and second charge pump circuits including a charging current source and a discharging current source, wherein said current sources included in said second charge pump circuit generate currents, the absolute values of which are smaller than the absolute values of currents generated by said current sources included in said first charge pump circuit;

said charging current source of said first charge pump circuit and said discharging current source of said second charge pump circuit being controlled by said first signal, and said discharging current source of said first charge pump circuit and said charging current source of said second charge pump circuit being controlled by said second signal;

a loop filter including a first capacitive element connected to a charge/discharge node, and a second capacitive element connected to the charge/discharge node through a resistive element, wherein said first capacitive element is charged and discharged by said first charge pump circuit, and said second capacitive element is charged and discharged by said second charge pump circuit; and a voltage regulator including a bipolar transistor for generating a base-emitter voltage as a reference for a predetermined voltage generated by said voltage regulator, a first resistive element connected in series with said bipolar transistor, a series connection of a second resistive element and a switching element connected in parallel with said first resistive element, and a temperature detector circuit for detecting a temperature to generate an output for controlling said switching element to switch the voltage generated by said voltage regulator in accordance with the detected temperature, wherein said first and second charge pump circuit are configured to operate with the predetermined voltage generated by said voltage regulator.

7. A semiconductor integrated circuit according to claim 6, wherein said reference signal is a phase-modulated signal, and said PLL circuit is a transmission PLL circuit for upconverting a transmission signal.

* * * * *